(12) United States Patent
Maesako

(10) Patent No.: US 6,205,046 B1
(45) Date of Patent: Mar. 20, 2001

(54) SYNCHRONOUS DYNAMIC RANDOM-ACCESS MEMORY

(75) Inventor: Taketo Maesako, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/425,242

(22) Filed: Oct. 25, 1999

(30) Foreign Application Priority Data

Oct. 27, 1998 (JP) .................................................. 10-305728

(51) Int. Cl.⁷ .................................................. G11C 13/00

(52) U.S. Cl. ................ 365/120; 365/230.08; 365/230.04

(58) Field of Search .............................. 365/233, 230.03, 365/120, 230.08, 238.5, 189.05

(56) References Cited

U.S. PATENT DOCUMENTS 5,991,232 * 11/1999 Matsumura et al. .................. 365/233
6,067,260 * 5/2000 Ooishi et al. ......................... 365/200

* cited by examiner

*Primary Examiner*—David Nelms
*Assistant Examiner*—Thong Le
(74) *Attorney, Agent, or Firm*—Young & Thompson

(57) ABSTRACT

The present invention provides a double data rate synchronous dynamic random-access memory (SDRAM) which allows a data mask signal to mask a data signal on a bit basis during write operation at a low frequency while maintaining compatibility with conventional SDRAMs and which increases the margin of the DRAM and the overall system. The double data rate synchronous dynamic random-access memory has address signal lines over which an unused column address signal is sent to a byte mask data latch circuit for use as the mask signal.

10 Claims, 13 Drawing Sheets

SYNCHRONOUS DYNAMIC RANDOM-ACCESS MEMORY

BACKGROUND OF THE INVENTION

1. Field of the Invention

The present invention relates to a synchronous dynamic random-access memory (hereinafter called SDRAM), and more particularly to a double data rate (DDR) SDRAM which masks input/output data signals to prevent data from being written into the memory.

2. Description of the Related Art

Conventionally, double data rate SDRAMs such as 128M-bit μPD45D128442, μPD45D128842, and μPD45D128164 have been made available from NEC Corporation. These SDRAMs are compatible with SSTL2 (Stub Series Terminal Logic for 2.5V).

FIG. 8 is a block diagram showing a conventional DDR SDRAM. This SDRAM comprises a clock generator 11 including a DLL (Delay-Lock Loop) 11a, a command decoder 12, a mode register 13, a control logic 14, a row address buffer and refresh counter 15, a column address buffer and burst counter 16, a row decoder 17, a memory cell array 18 composed of banks, a sense amplifier 19, a column decoder 20, a data control circuit 21, a latch circuit 22, a byte mask data latch circuit 23b, and an input/output buffer 24.

In the SDRAM described above, the clock generator 11 receives the clock signal CLK, the active-low clock signal/CLK, the clock enable signal CKE, and so on and, at the same time, outputs the internal (first) clock signal. The DLL 11a receives the clock signal CLK and the active-low clock signal /CLK and, at the same time, outputs the delay (second) clock signal. The delay clock signal from the DLL 11a drives only the input/output buffer 24 provided in the SDRAM. The command decoder 12 receives the chip select signal /CS, the column address strobe signal /CAS, the row address strobe signal /RAS, and the write enable signal /WE and, at the same time, outputs various control signals to the control logic 14.

The column address signals A0–A11 and the bank selection signals BA0 and BA1 are sent to the mode register 13, the row address buffer and refresh counter 15, and the column address buffer and burst counter 16, respectively. The data signal DQ and the data strobe signal DQS are input to, or output from, the input/output buffer 24. In addition, the data mask signal DM is sent to a byte mask data latch circuit 23b.

The byte mask data latch circuit 23b described above comprises two latch circuits, 31 and 33, and an inverter 32 as shown in the block diagram in FIG. 9. The data mask signal DM is sent to the latch circuits 31 and 33 from an external memory controller (not shown in the figure). The data strobe signal DQS is also sent to the latch circuits 31 and 33. The byte mask data latch circuit 23b outputs the mask signals MASK1 and MASK2. These mask signals MASK1 and MASK2 are signals that inhibit writing data into the internal memory to prevent data from being written into the memory cell array 18.

As shown in FIG. 10, this SDRAM receives a write command on the rising edge of the clock signal CLK and, at the same time, receives the column address signals A0–A8 (×8 device). Then, the data strobe signal DQS and the data signal DQ described above are sent to the SDRAM.

Unlike a single data rate SDRAM, this DDR SDRAM synchronizes with both the rising edge and the falling edge of the data strobe signal DQS to receive the data signal DQ to double the data rate. The data mask signal DM is latched by the latch circuits 31 and 33 in synchronization with both the rising edge and the falling edge of the data strobe signal DQS. The data mask signal DM, when high, masks the data signal to prevent data from being written into the memory cell array 18.

The data strobe signal DQS latches the data mask signal DM on both the rising edge and the falling edge as described above. Therefore, the data mask signal DM is sent to both the latch circuits 31 and 33 of the byte mask data latch circuit 23b shown in FIG. 9.

FIG. 10 is a timing diagram illustrating the operation of the SDRAM. The diagram in FIG. 10 indicates that the data mask signal DM operates at the same frequency as that of the clock signal CLK and that the data signal DQ may be masked on a bit basis. In this case, the DDR SDRAM can operate twice as fast as a single data rate SDRAM.

As described above, the conventional SDRAM, which allows the data signal DQ to be masked on a bit basis, operates at a frequency twice as high as that of the single data rate SDRAM. However, this SDRAM requires rigorous setup times and hold times during data input, making it difficult to obtain even an enough system margin.

To solve this problem, consider an SDRAM such as the one shown in FIG. 11. This SDRAM circuit receives an additional data mask signal DM2 from an external memory controller (not shown in the figure), thus making it possible to use two separate data mask signals: one for use when the data strobe signal DQS rises and the other for use when the data strobe signal DQS falls. FIG. 12 is a block diagram of a byte mask data latch circuit 23c included the SDRAM shown in FIG. 11. FIG. 13 is a timing diagram illustrating the operation of the byte mask data latch circuit 23c. The problem with the byte mask data latch circuit 23c is that it requires an additional pin for external connection because of two data mask signals, DM and DM2. Thus, it does not maintain compatibility with conventional products.

SUMMARY OF THE INVENTION

It is an object of the present invention to provide a synchronous dynamic random-access memory (SDRAM) which uses data mask signals to perform byte mask operation on a bit basis at a low frequency while maintaining compatibility with conventional SDRAMs and which provides enough margins not only for the DRAM but for the overall system.

The double data rate synchronous dynamic random-access memory according to the present invention uses unused column address signals for data mask signals for use when the data strobe signal rises and falls to mask data signals on a bit basis.

The double data rate synchronous dynamic random-access memory according to the present invention has a multiple-bank memory cell array driven in synchronization with a first clock, the synchronous dynamic random-access memory comprising an input/output buffer to or from which data signals of the synchronous dynamic random-access memory are input or output in response to a second clock synchronizing with the first clock; a latch circuit which performs an input/output of the data signals between the input/output buffer and the memory cell array; and a byte mask data latch circuit which allocates an unused column address signal to the latch circuit for use when the data strobe signal rises or falls for outputting a mask signal; wherein the mask signal write-masks the input/output of the latch circuit.

The configuration according to the present invention makes the synchronous dynamic random-access memory compatible with conventional products and, at the same time, masks data signals during byte mask operation at a low frequency on a bit basis.

According to the present invention, the setup time and the hold time during data input become long as in the single data rate operation, giving enough margins not only to the SDRAM but to the whole system. Furthermore, using an unused column address signal for masking data ensures compatibility with conventional products with no additional pin. In addition, on conventional products, the SSTL interface must be used to operate at the same frequency at which the clock signal CLK, active-low clock signal /CLK, data strobe signal DQS, and data signal DQ operate. On the other hand, the configuration according to the present invention eliminates the need for that interface, thus reducing the system current consumption.

DESCRIPTION OF THE PREFERRED EMBODIMENTS

Figure 1:
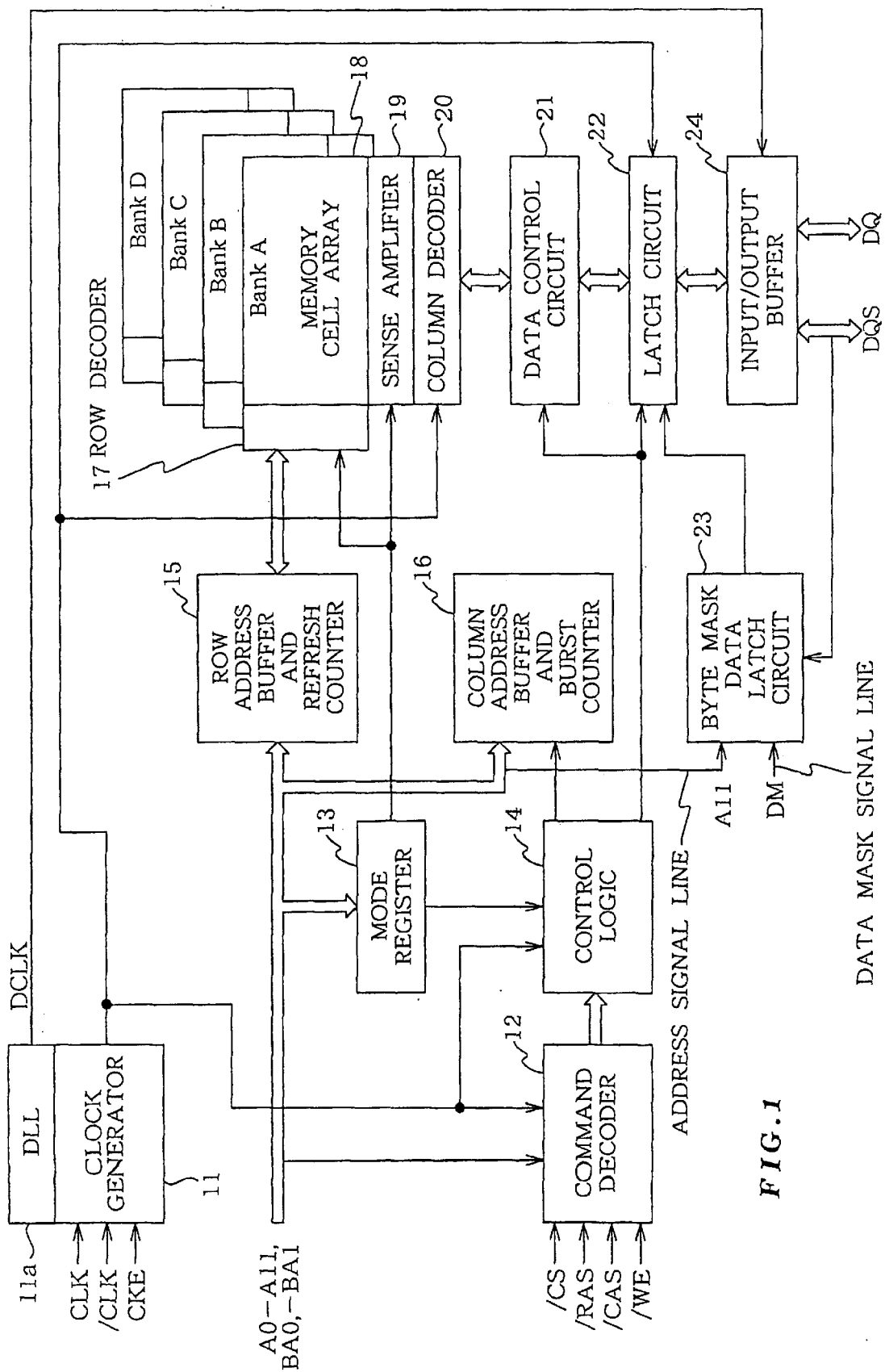
FIG. 1 a block diagram showing a synchronous dynamic random-access memory of a first embodiment according to the present invention.

FIG. 1 is a block diagram of a double data rate (DDR) SDRAM, or a synchronous DRAM, of a first embodiment according to the present invention. The double data rate (DDR) SDRAM of this embodiment comprises a clock generator 11 including a DLL (Delay-Lock Loop) 11a, a command decoder 12, a mode register 13, a control logic 14, a row address buffer and refresh counter 15, a column address buffer and burst counter 16, a row decoder 17, a memory cell array 18 composed of four banks (A–D), a sense amplifier 19, a column decoder 20, a data control circuit 21, a latch circuit 22, a byte mask data latch circuit 23, and an input/output buffer 24.

The SDRAM in this embodiment, though fully pincompatible (the pin configuration is compatible) with conventional SDRAMs, has the byte mask data latch circuit 23 that receives a column address signal A11. The address signal A11 is received through address signal line. In this embodiment, a 64M-bit SDRAM is shown. The byte mask data latch circuit 23 described above generates a signal which determines whether to write data into the memory cell array in response to the received mask data.

Figure 2:
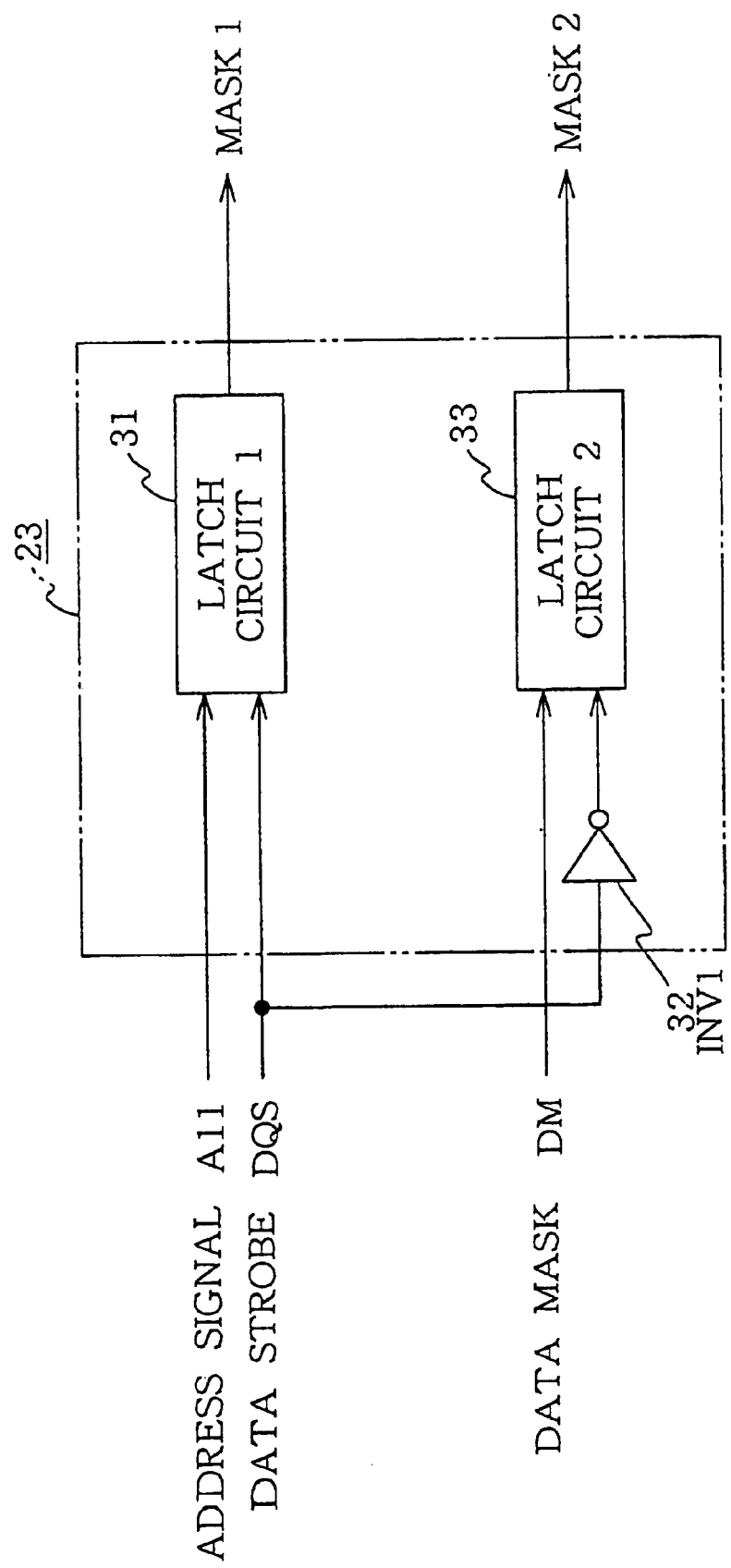
FIG. 2 is a block diagram showing the byte mask data latch circuit shown in FIG. 1.

FIG. 2 is a detailed circuit block diagram showing the byte mask data latch circuit 23. This byte mask data latch circuit 23 comprises two latch circuits: 31 and 33. The latch circuits 31 latches the data of the column address signal A11 on the rising edge of the data strobe signal DQS supplied from an external unit and outputs the byte mask signal MASK1. On the other hand, the latch circuits 33 latches the data of the data mask signal DM on the falling edge of the data strobe signal DQS and outputs the byte mask signal MASK2.

Figure 3:
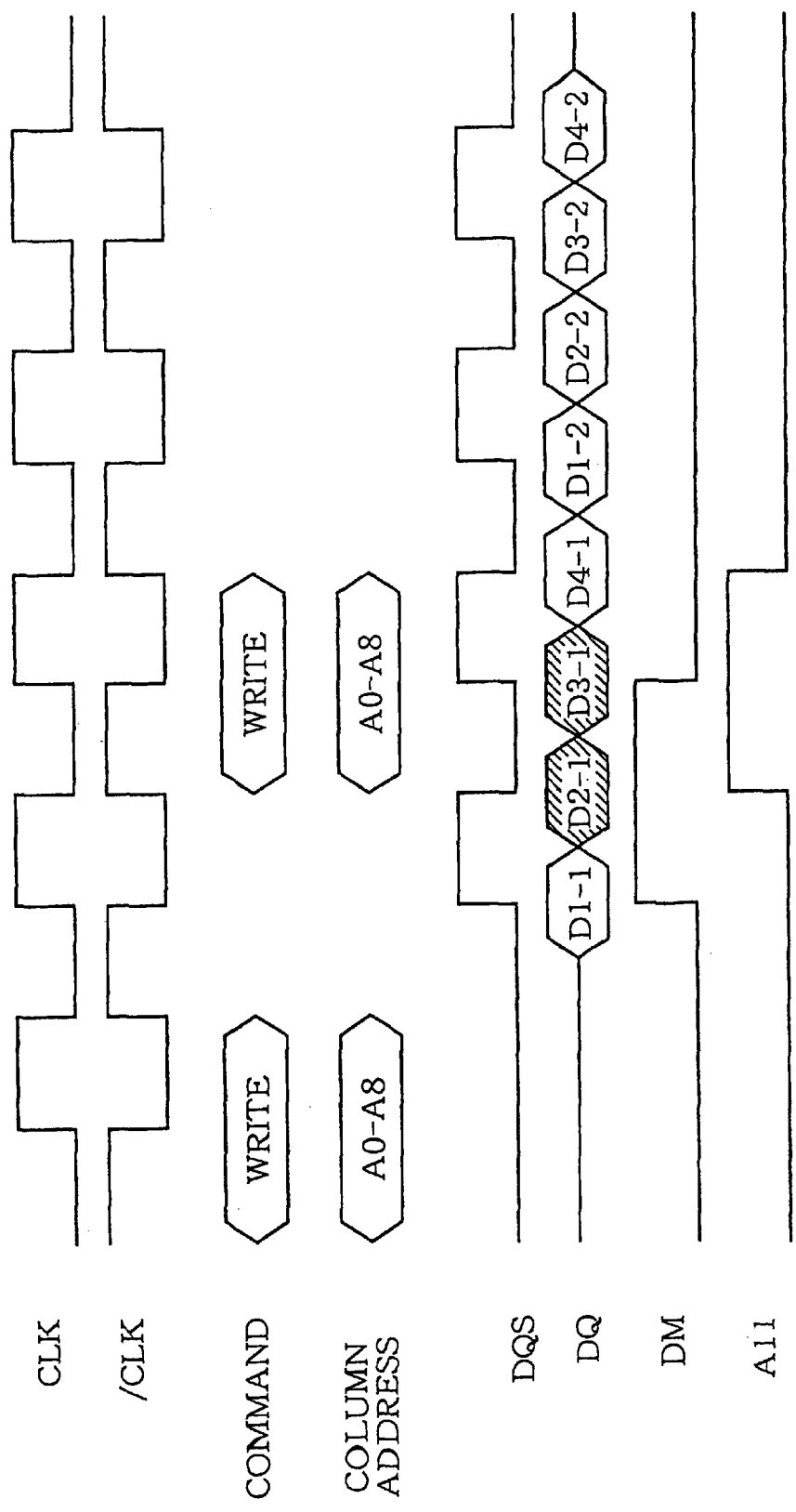
FIG. 3 is a timing diagram showing the operation of the synchronous dynamic random-access memory shown in FIG. 1.

FIG. 3 is a detailed timing diagram showing the operation of the SDRAM shown in FIG. 1. The burst length of this embodiment is 4. Referring to FIG. 3, the timing in which the operation is performed in this embodiment will be described. First, the SDRAM receives a write command on the rising edge of the clock signal CLK and, at the same time, receives the starting column address A0–A8 (×8 bit address). Then the SDRAM receives the data strobe signal DQS and the data signal DQ.

As shown in FIG. 3, the column address signal A11, which is separate from the data mask signal DM, allows each of two signals (data mask signal DM and column address signal A11) to be used for one bit of double-rate data. That is, the signals are allocated such that the data mask signal DM is used for a bit that is read on the falling edge of the data strobe signal DQS and the column address signal A11 is used for a bit that is read on the rising edge of the data strobe signal DQS. At that time, any column address signal not used for column address specification may be used.

The data mask signal DM is latched on the falling edge of the data strobe signal DQS. The data mask signal DM, when high, masks the data that is read and prevents the input/output data from being written into the memory cell array 18. Similarly, the column address signal A11 is latched on the rising edge of the data strobe signal DQS. The column address signal A11, when high, masks the data that is read and prevents the input/output data from being written into the memory cell array 18. It should be noted that the data mask signal DM and the column address signal A11 may be reversed.

An example of timing is shown in FIG. 3. In this example, the data mask signal DM generates the byte mask signal MASK2 that masks data (D2-1). Similarly, the column address signal A11 generates the byte mask signal MASK1 that masks data (D3-1).

The column address signal A11 is not used for a column address during burst operation. Therefore, it may be used for masking data while ensuring compatibility with conventional SDRAMs.

Figure 4:
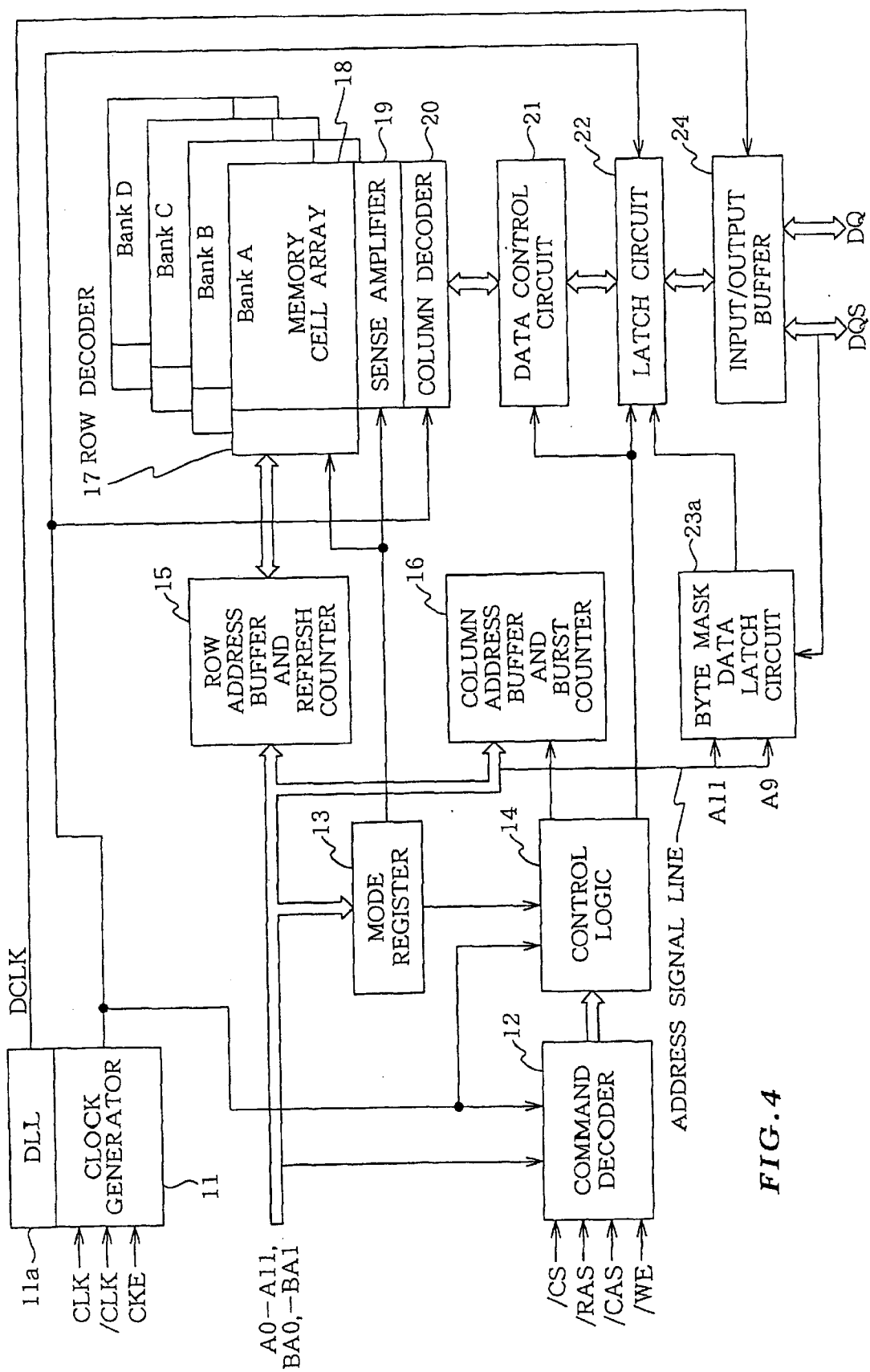
FIG. 4 is a block diagram showing a synchronous dynamic random-access memory of a second embodiment according to the present invention.
Figure 5:
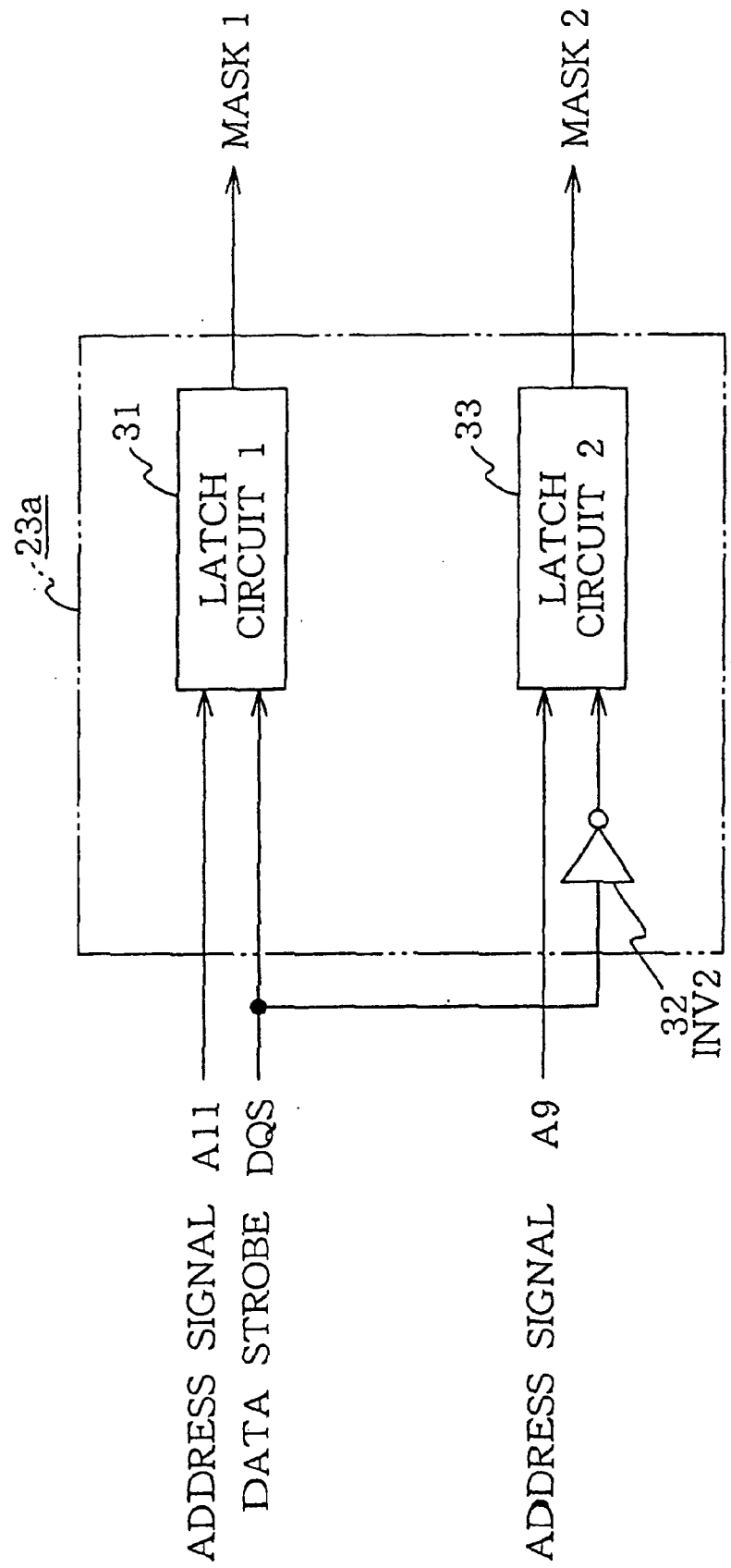
FIG. 5 is a block diagram showing the byte mask data latch circuit shown in FIG. 4.
Figure 6:
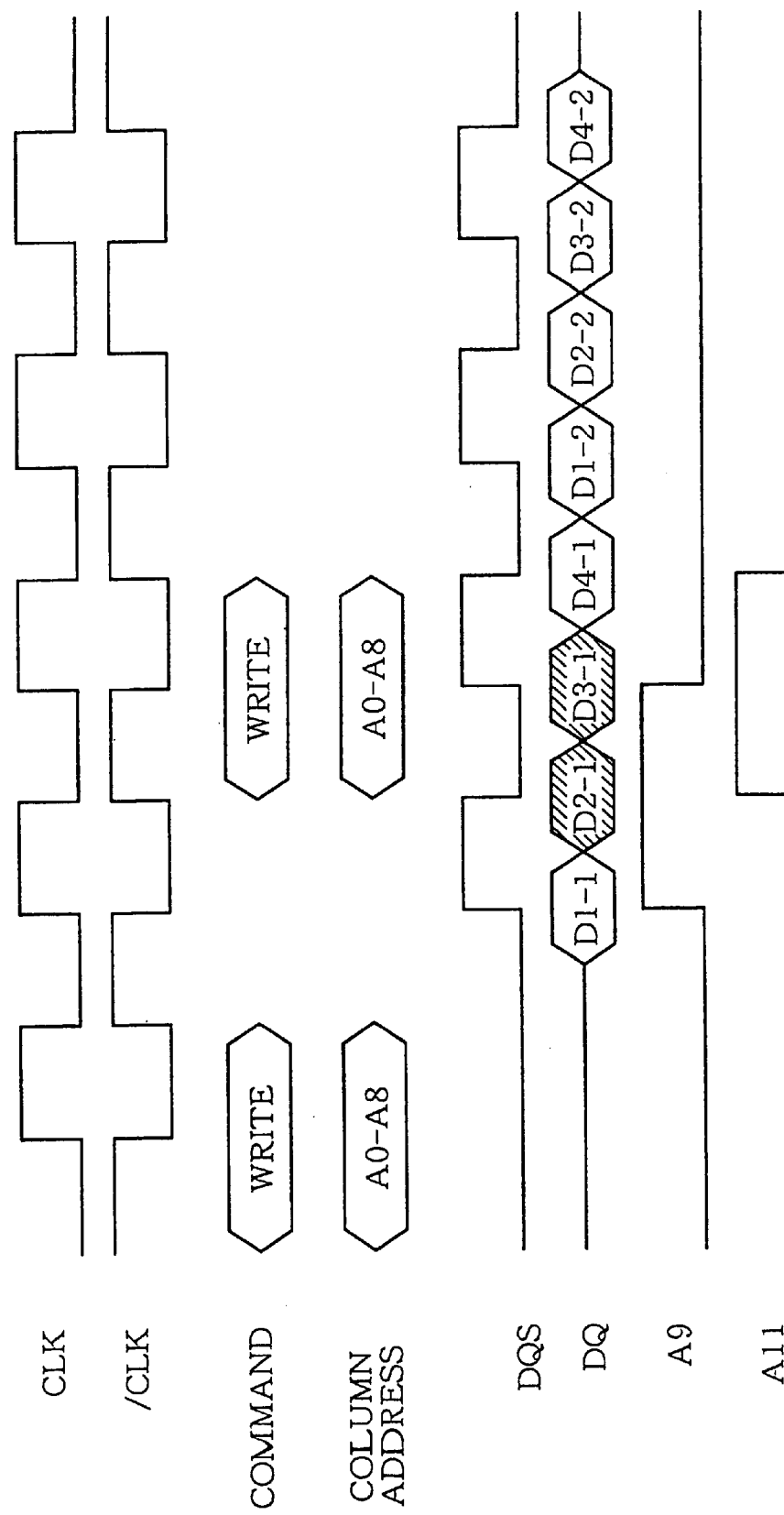
FIG. 6 is a timing diagram showing the operation of the synchronous dynamic random-access memory shown in FIG. 4.
Figure 7:
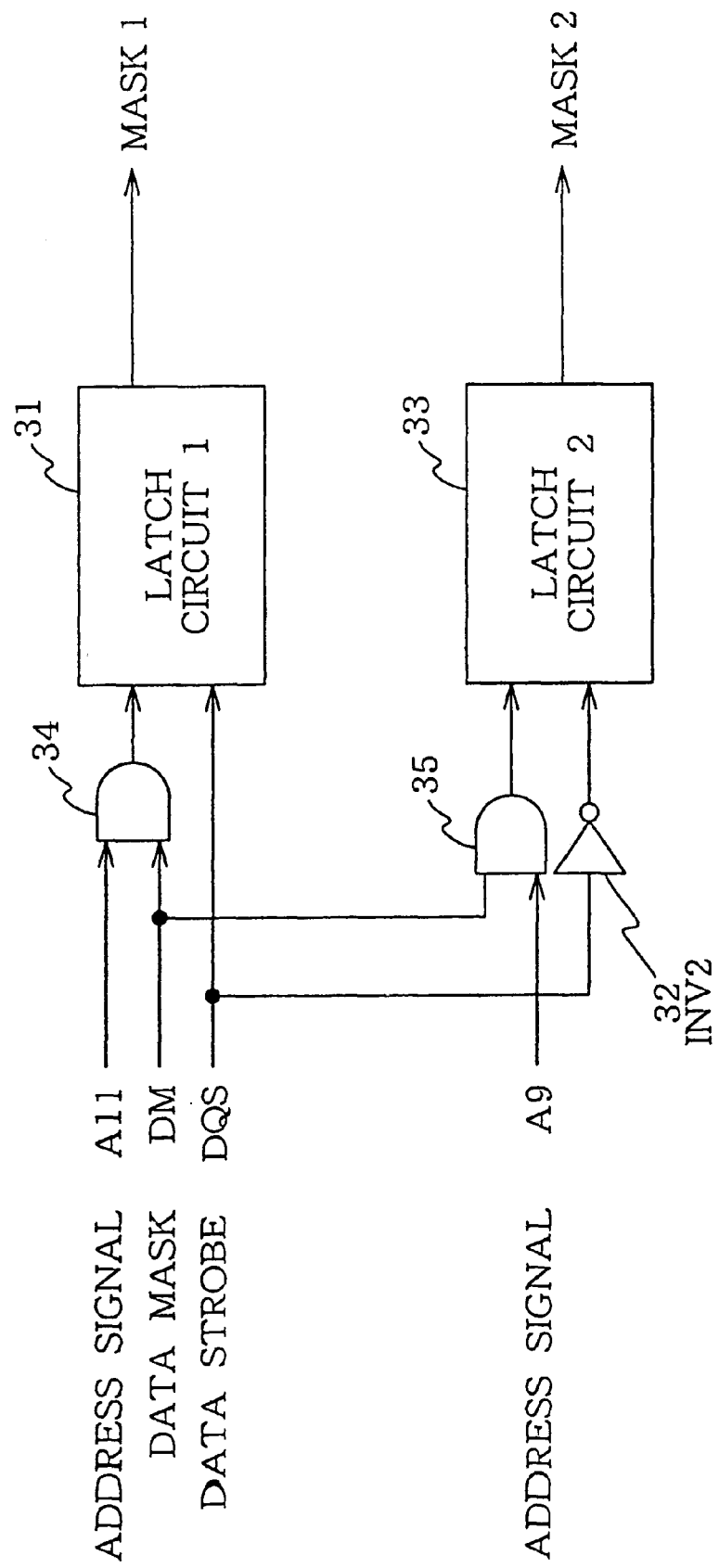
FIG. 7 is block diagram showing another configuration of the byte data latch circuit shown in FIG. 4.
Figure 8:
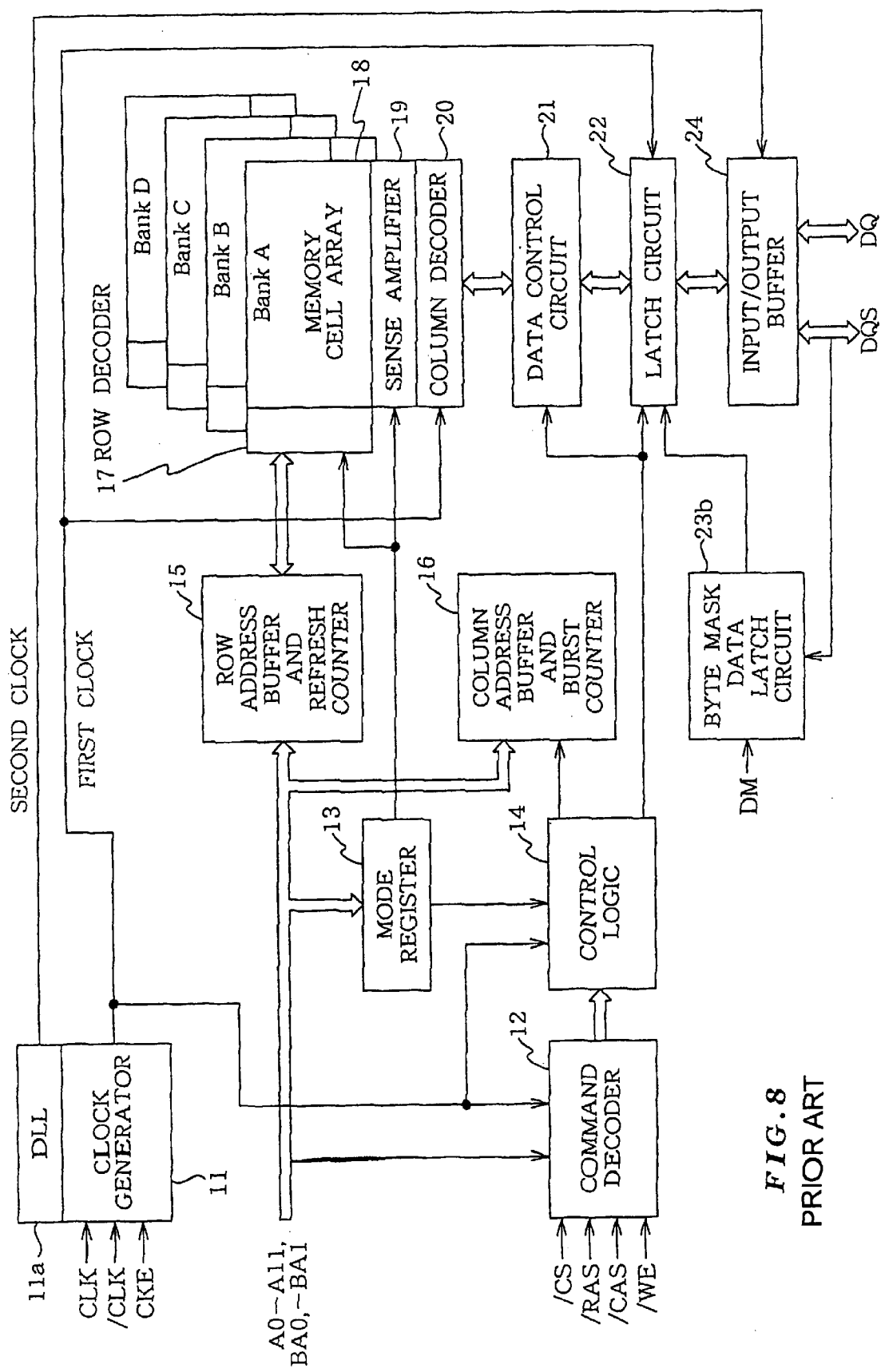
FIG. 8 is a block diagram showing a conventional synchronous dynamic random-access memory.
Figure 9:
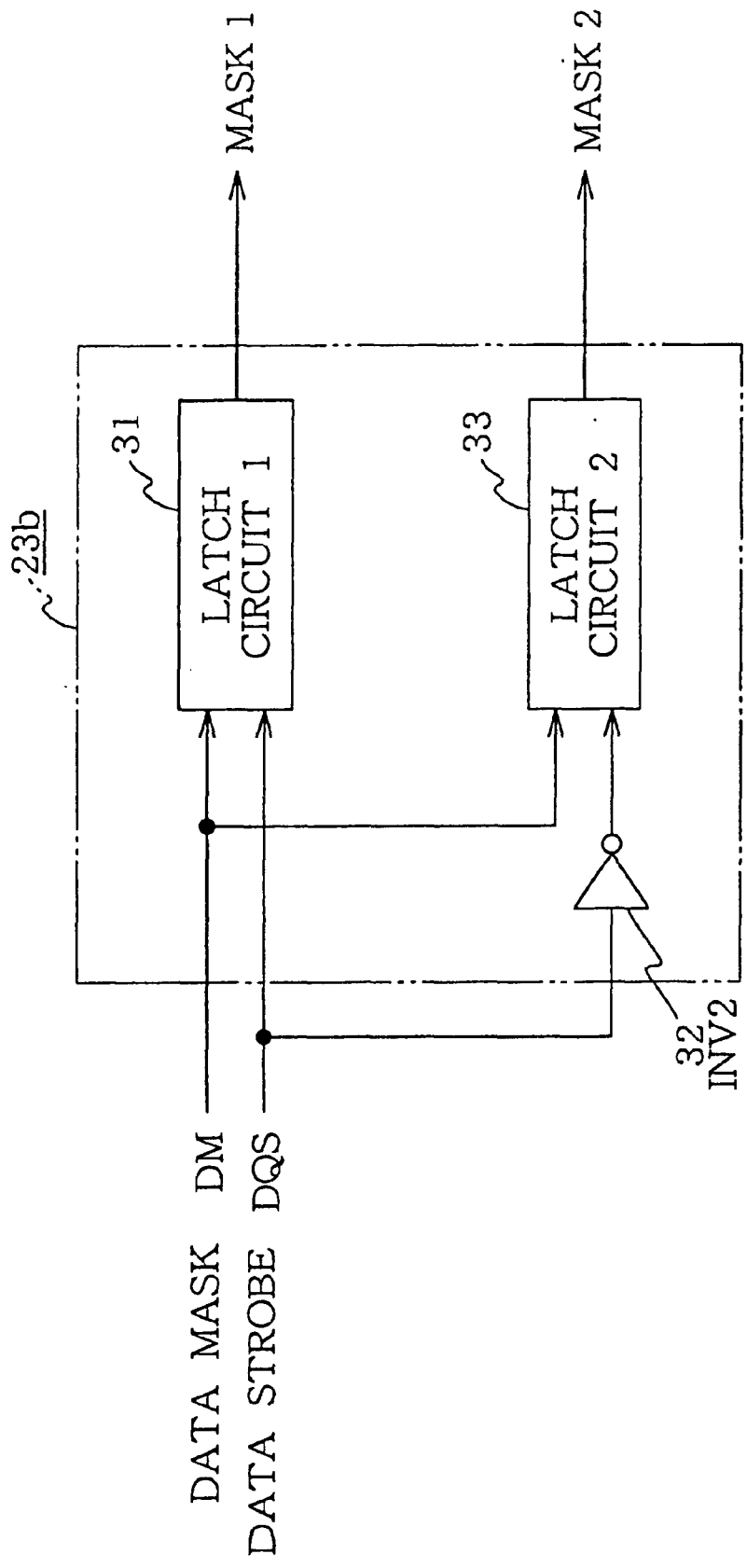
FIG. 9 is a block diagram showing the byte mask data latch circuit shown in FIG. 8.
Figure 10:
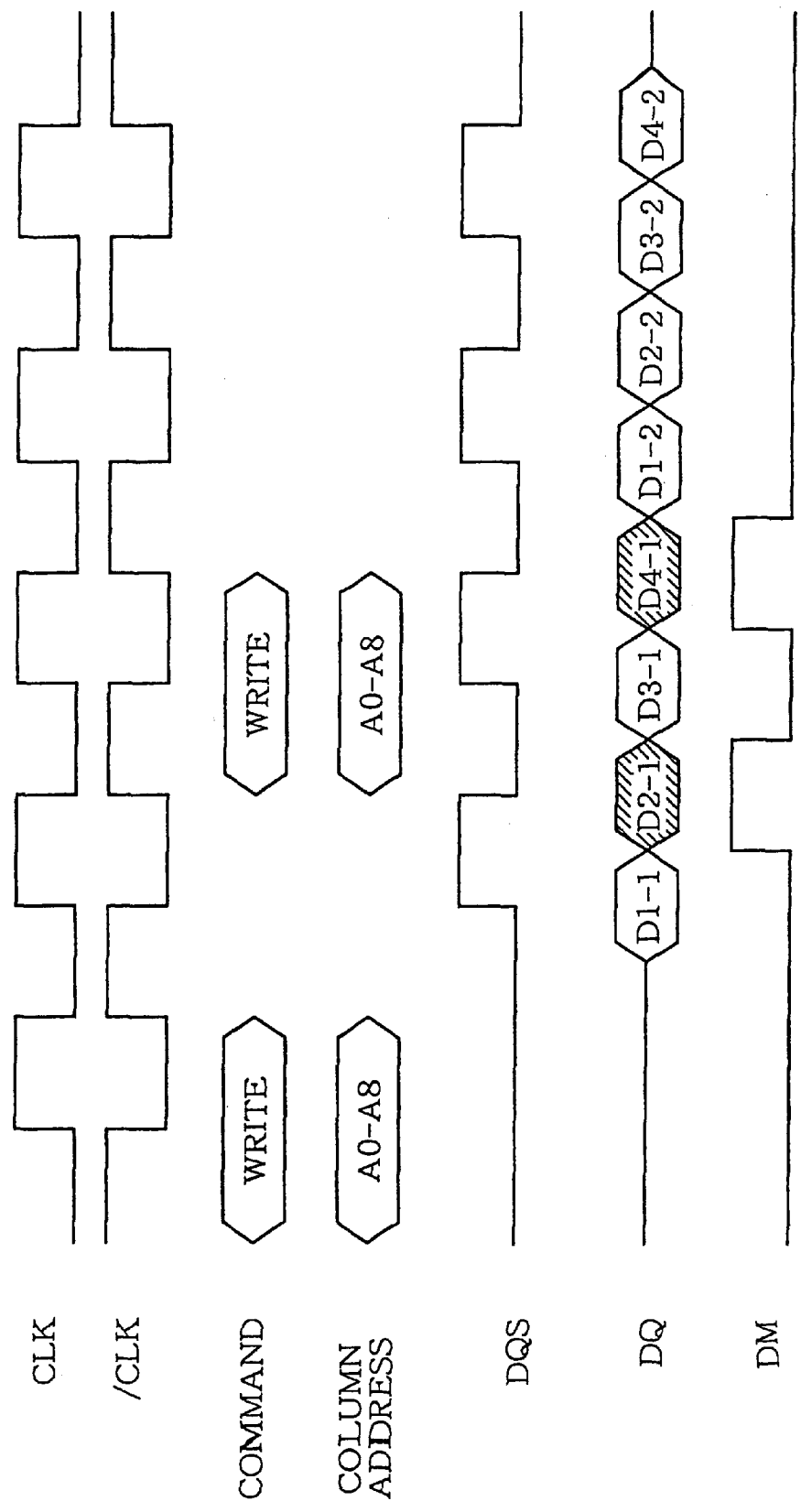
FIG. 10 is a timing diagram showing the operation of the synchronous dynamic random-access memory shown in FIG. 8.
Figure 11:
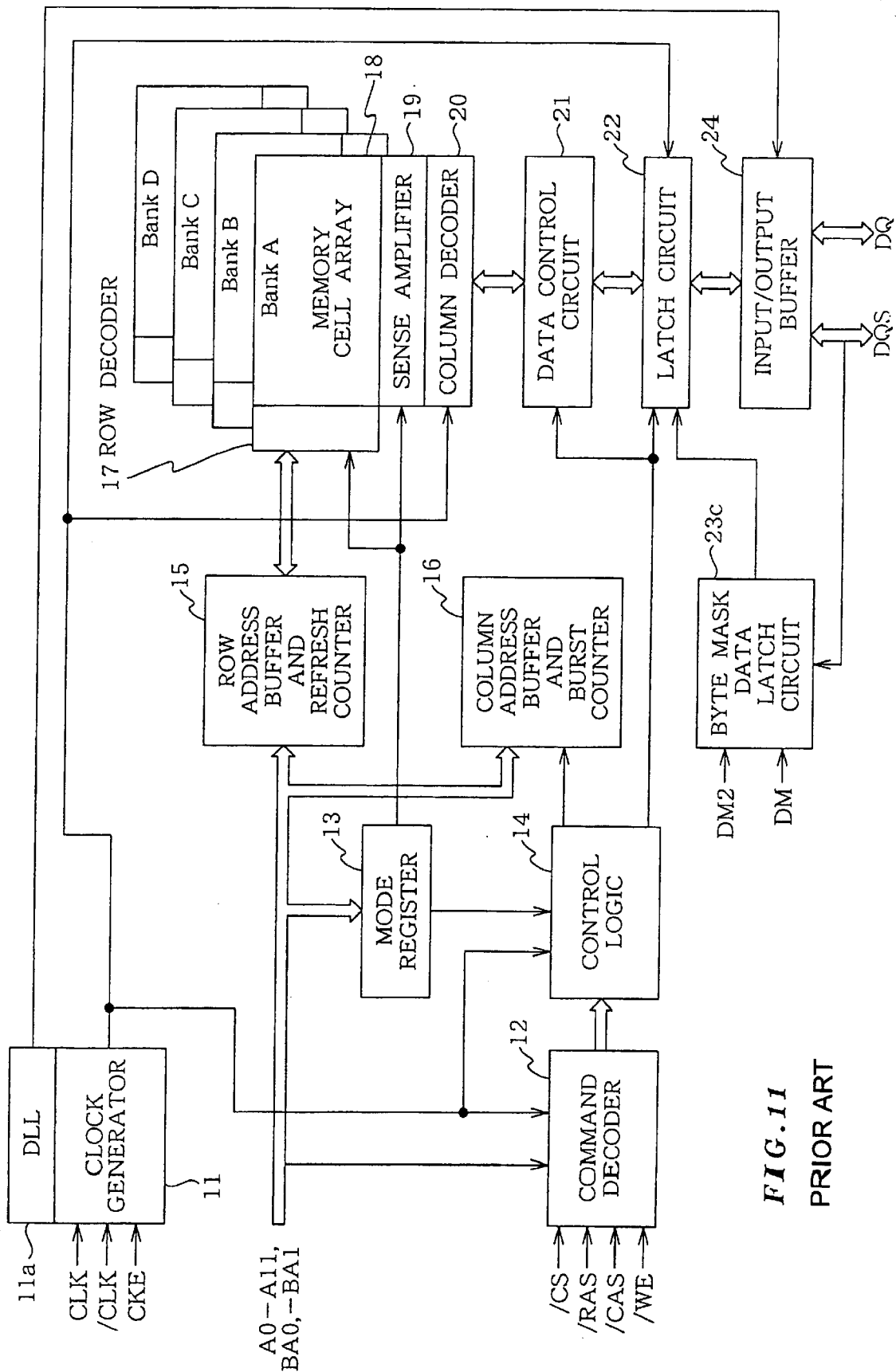
FIG. 11 is a block diagram showing an improved conventional synchronous dynamic random-access memory.
Figure 12:
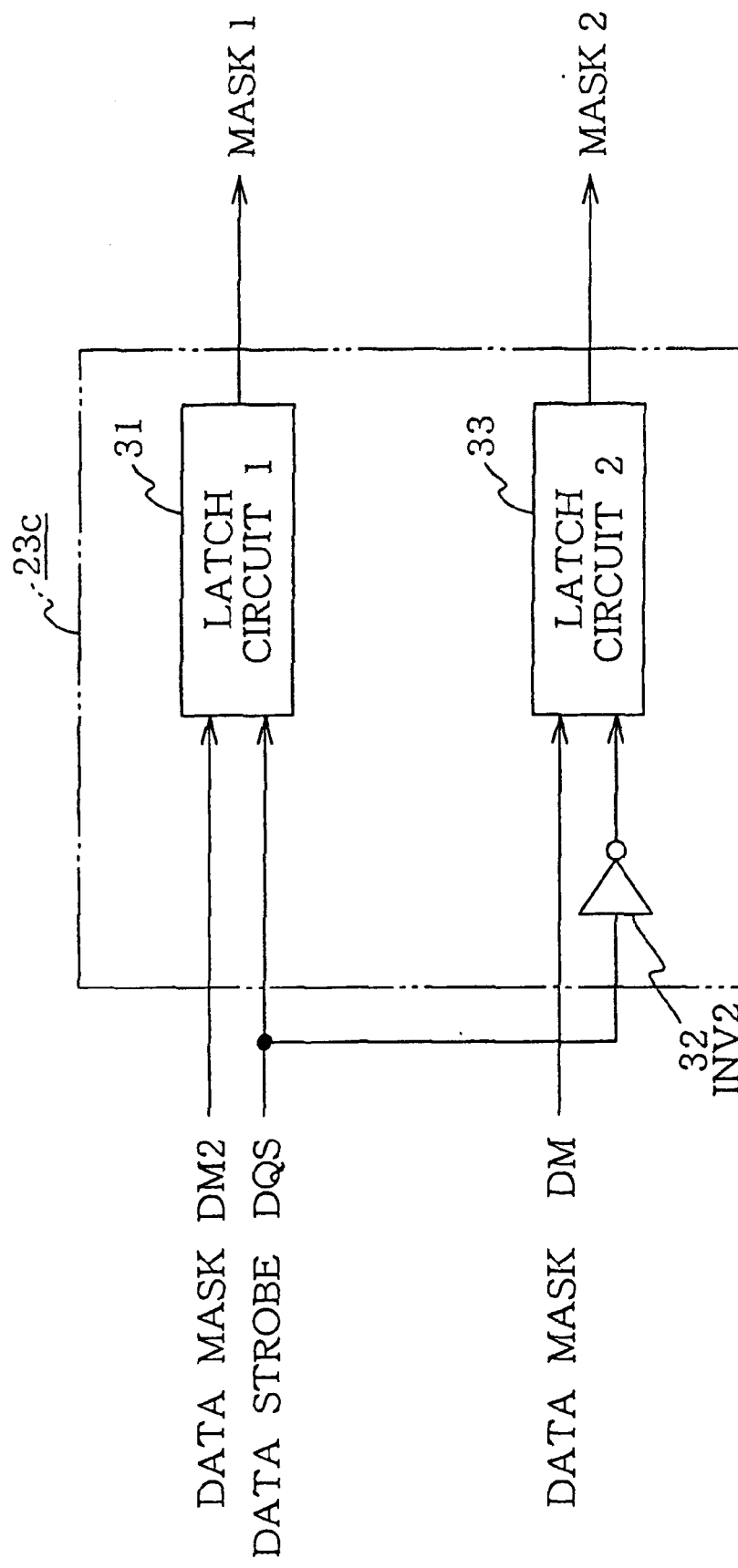
FIG. 12 is a block diagram showing the byte mask data latch circuit shown in FIG. 11.
Figure 13:
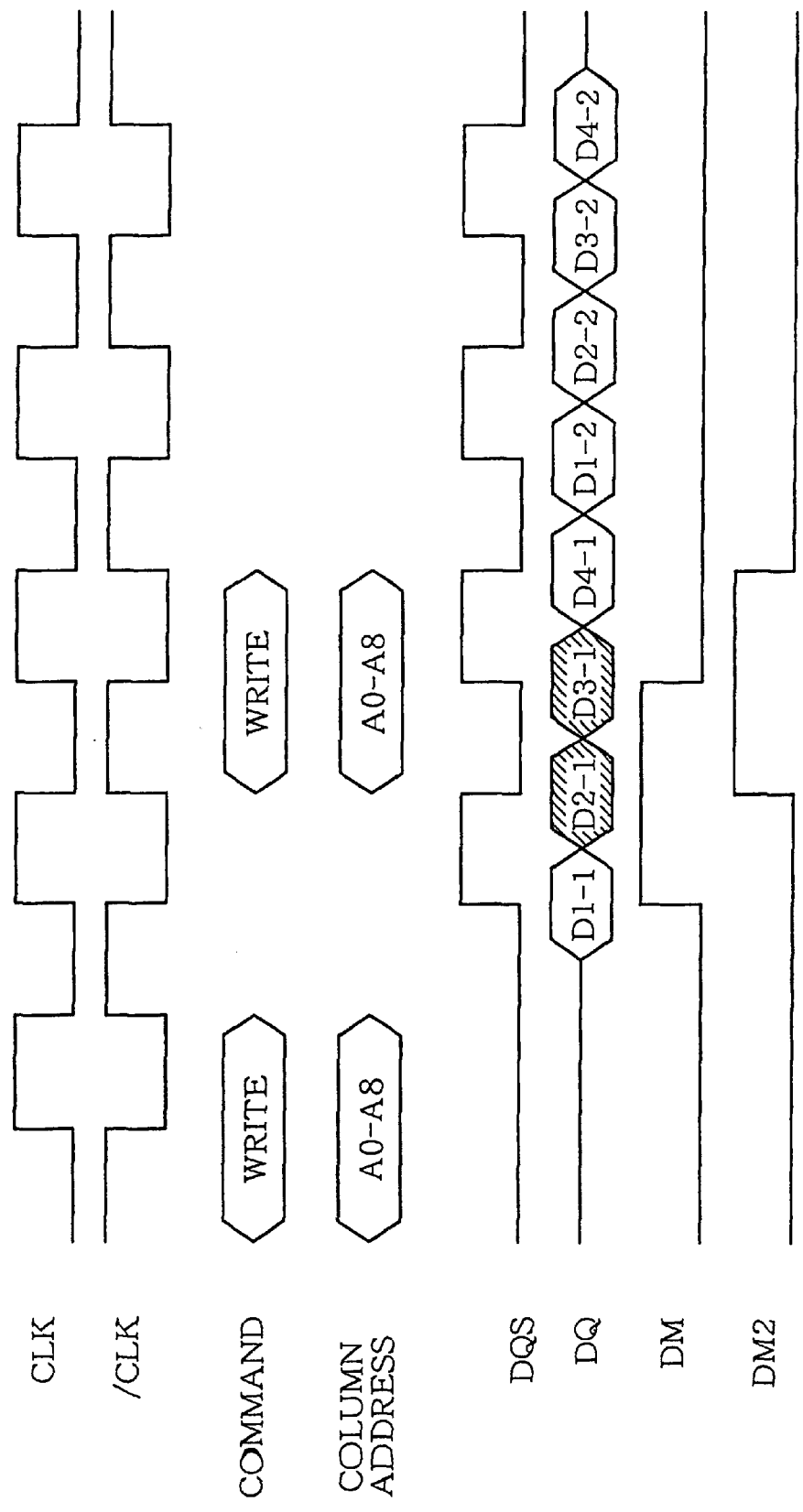
FIG. 13 is a timing diagram showing the operation of the synchronous dynamic random-access memory shown in FIG. 11.

FIG. 4 is a block diagram of a second embodiment according to the present invention. The configuration is basically the same as that shown in FIG. 1 except that the data mask signal DM is replaced by another column address signal A9 that is not used. FIG. 5 is a detailed block diagram of a byte mask data latch circuit 23a of the embodiment shown in FIG. 4. FIG. 6 is a timing diagram illustrating the operation of the embodiment shown in FIG. 4. The operation is the same as that of the embodiment shown in FIG. 1. The embodiment shown in FIG. 4 uses two column address signals, A9 and A11, which eliminate the need for using the data mask signal DM.

To use the data mask signal DM in this byte mask data latch circuit 23a, AND circuits 34 and 35 should be used to AND the address signals, A9 and A11, and the data mask signal DM. When the data mask signal DM is high and when the column address signal A11 or A9 is high, the input/output data should be masked. For an ×16 bit device that has two data mask signals DM, these two signals may be used to perform the above control operation.

In the synchronous dynamic random-access memory according to the present invention, the mask signal allocated when the data strobe signal rises is separate from the mask signal allocated when the data strobe signal falls as described above. This allows the data mask signal and the column address signal to operate at a low frequency as if they were used for a single data rate synchronous DRAM. As a result, the setup time and the hold time during data input becomes long as in the single data rate operation, giving enough margins not only to the SDRAM but to the whole system.

Furthermore, using an unused column address signal for masking data ensures compatibility with conventional products with no additional pin. In addition, on conventional products, the SSTL interface must be used to operate at the same frequency at which the conventional clock signal CLK, active-low clock signal /CLK, data strobe signal DQS, and data signal DQ operate. On the other hand, the configuration according to the present invention eliminates the need for that interface, thus reducing the system current consumption.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 10-305728 (Filed on Oct. 27, 1998) including specification, claims, drawings and summary are incorporated herein by reference in its entirety.

What is claimed is:

1. A double data rate synchronous dynamic random-access memory comprising:
an address signal line over which an unused column address signal is sent to a byte mask data latch circuit to form a mask signal.

2. A double data rate synchronous dynamic random-access memory comprising:
an address signal line over which an unused column address signal is sent to a byte mask data latch circuit, wherein said column address signal is allocated for a rising edge or a falling edge of a data strobe signal to form a mask signal of a data signal to allow data to be masked on a bit basis during writing.

3. The double data rate synchronous dynamic random-access memory according to claim 1, further comprising a data mask signal line over which a data mask signal is sent to said byte mask data latch circuit to form the mask signal.

4. The double data rate synchronous dynamic random-access memory according to claim 2, further comprising a data mask signal line over which a data mask signal is sent to said byte mask data latch circuit to form the mask signal.

5. The double data rate synchronous dynamic random-access memory according to claim 1 wherein the two unused low-order column address signals are used as data mask signals.

6. The double data rate synchronous dynamic random-access memory according to claim 2 wherein the two unused low-order column address signals are used as data mask signals.

7. A double data rate synchronous dynamic random-access memory having a multiple-bank memory cell array driven in synchronization with a first clock, said synchronous dynamic random-access memory comprising:
an input/output buffer to or from which data signals of the synchronous dynamic random-access memory are input or output in response to a second clock synchronizing with said first clock;
a latch circuit which performs an input/output of the data signals between the input/output buffer and the memory cell array; and
a byte mask data latch circuit which allocates an unused column address signal to the latch circuit for use when said data strobe signal rises or falls for outputting a mask signal; wherein said mask signal write-masks the data signals.

8. The double data rate synchronous dynamic random-access memory according to claim 7 wherein said byte mask data latch circuit comprises a first latch circuit and a second latch circuit, said first latch circuit latching the data mask signal supplied from an external of the memory in response to a data strobe signal and the second latch circuit latching the unused column address signal in response to a inverse of data strobe signal.

9. The double data rate synchronous dynamic random-access memory according to claim 7 wherein said byte mask data latch circuit comprises a first latch circuit and a second latch circuit, said first and second latch circuits latching the two unused column address signals in response to the data strobe signal and an inverse thereof.

10. The double data rate synchronous dynamic random-access memory according to claim 9 wherein said byte mask data latch circuit outputs logical products of said two unused column address signals and said data mask signal and, at the same time, latches the logical products.

* * * * *